(12) United States Patent
Ziaja et al.

(10) Patent No.: US 8,074,133 B2
(45) Date of Patent: Dec. 6, 2011

(54) METHOD AND APPARATUS FOR TESTING DELAY FAULTS

(75) Inventors: Thomas A. Ziaja, Austin, TX (US);
Kevin D. Woodling, Austin, TX (US);
Robert F. Molyneaux, Austin, TX (US)

(73) Assignee: Oracle America, Inc., Redwood City, CA (US)

( * ) Notice: Subject to any disclaimer, the term of this patent is extended or adjusted under 35 U.S.C. 154(b) by 258 days.

(21) Appl. No.: 12/187,145

(22) Filed: Aug. 6, 2008

(65) Prior Publication Data

US 2010/0037111 A1 Feb. 11, 2010

(51) Int. Cl.
*G01R 31/28* (2006.01)
(52) U.S. Cl. .................................................... 714/731
(58) Field of Classification Search .................. 714/726, 714/729, 744, 731
See application file for complete search history.

(56) References Cited

U.S. PATENT DOCUMENTS

| | | | | |
|---|---|---|---|---|
| 6,822,482 | B2* | 11/2004 | Campbell | 326/93 |
| 6,996,759 | B2* | 2/2006 | Price | 714/726 |
| 7,076,709 | B2* | 7/2006 | Vermeulen et al. | 714/729 |
| 7,134,061 | B2* | 11/2006 | Agashe et al. | 714/726 |
| 7,155,651 | B2* | 12/2006 | Nadeau-Dostie et al. | 714/731 |
| 7,373,568 | B1* | 5/2008 | Horovitz | 714/726 |
| 7,437,636 | B2* | 10/2008 | Rajski et al. | 714/726 |
| 7,451,371 | B2* | 11/2008 | Wang et al. | 714/729 |
| 7,689,885 | B2* | 3/2010 | Kaibel et al. | 714/731 |
| 7,739,568 | B1* | 6/2010 | Bertanzetti | 714/729 |
| 2006/0282727 | A1* | 12/2006 | Hoshaku | 714/726 |

* cited by examiner

*Primary Examiner* — James C Kerveros
(74) *Attorney, Agent, or Firm* — Polsinelli Shughart PC

(57) ABSTRACT

An apparatus or method for testing of a SOC processor device may minimize interference that is caused by interfacing a comparatively low-speed testing device with the high-speed processor during testing. Implementations may gate the input clock signal at the clock input to each domain of the SOC processor device rather than at the output of the PLL clock. The gating of the clock signal to each domain may then be controlled by clock stop signals generated by the testing device and sent to the individual domains of the processor device. Gating the clock signal at the domain may provide a more natural state for the circuit during testing as well as allow the test control unit to test the different domains of the SOC device individually.

19 Claims, 3 Drawing Sheets

METHOD AND APPARATUS FOR TESTING DELAY FAULTS

FIELD OF THE INVENTION

Aspects of the present invention relate to testing of system-on-a-chip (SOC) devices. More particularly, aspects involve a method and apparatus for testing delay faults on a device while preserving the native functional environment of the device under test.

BACKGROUND

System-on-a-chip (SOC) processors generally go through automatic test pattern generation (ATPG) testing after manufacturing to test for failures in the design and manufacturing process of the device. One type of ATPG testing is known as delay fault testing. Delay fault testing provides a test pattern to a SOC processor under test and determines whether the SOC device meets the expected timing analysis as the test pattern is propagated through the device.

Because most testers cannot produce clock speeds at the same high frequency as modern SOC processors, many testers utilize the internal clock generated by the processor to perform the at-speed testing of the processor. As a result, delay fault testing of high-speed SOC processor devices by typical ATPG testers has proven particularly difficult.

SUMMARY

As described above, typical ATPG testers utilize the internal clock generated by the processor under test to perform at-speed testing. However, this approach may not provide accurate test results. Because the clock distribution system, or clock tree, of a SOC processor is finely tuned to run at high frequencies, interfacing the processor device with a comparatively low-speed testing device may provide undesired noise within the testing signal resulting in inaccurate timing analysis. Further, interference with the native internal clock distribution can lead to delay fault tests which are inaccurate or error-prone as the internal clock signals can not propagate freely throughout the processor device.

Thus, what is needed is a method or apparatus that can perform delay fault testing on a SOC processor device that utilizes the internally generated clock while minimizing the interference that occurs when interfacing the testing device with the high-speed processor device.

One aspect of a possible solution involves a method for testing at least one domain of a processor device, where the processor device includes a plurality of domains. The method comprises controlling a gate coupled to the at least one domain. The gate is configured to control propagation of a clock signal into the at least one domain. Further, the gate controls propagation without affecting propagation of the clock signal to other domains of the processor device.

Another aspect involves a system for testing at least one domain of a processor device, where the processor device includes a plurality of domains. The system comprises controlling a gate coupled to the at least one domain. The gate is configured to control propagation of a clock signal into the at least one domain. Further, the gate controls propagation without affecting propagation of the clock signal to other domains of the processor device.

A further aspect involves a computer-implemented system for testing at least one domain of a processor device, where the processor device includes a plurality of domains. The computer-implemented system comprises controlling a gate coupled to the at least one domain. The gate is configured to control propagation of a clock signal into the at least one domain. Further, the gate controls propagation without affecting propagation of the clock signal to other domains of the processor device.

DETAILED DESCRIPTION

Figure 1:
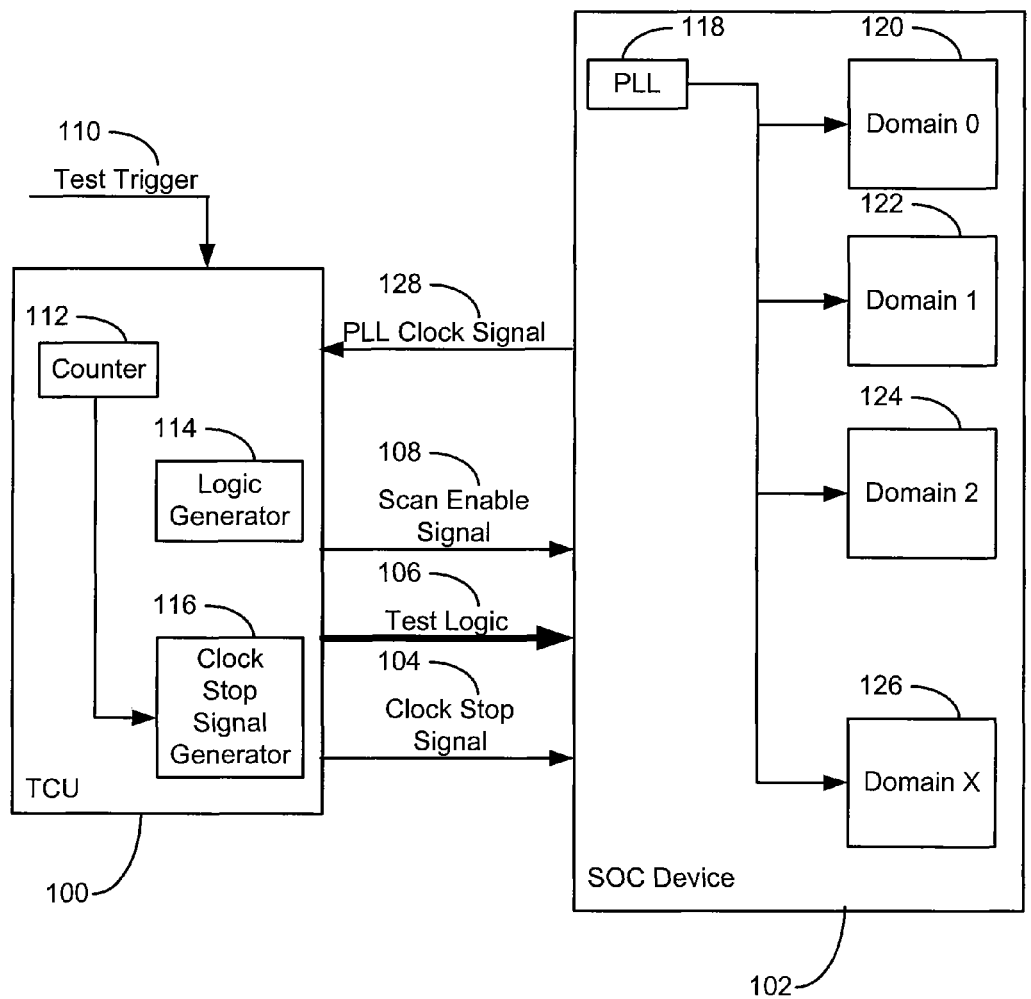
FIG. 1 is a block diagram illustrating one embodiment of the present invention providing a SOC device under a delay fault test.

One particular implementation conforming to aspects of the present invention takes the form of an apparatus or method for delay fault testing of a SOC processor device. The implementation may minimize interference that is caused by interfacing a comparatively low-speed testing device with the comparatively high-speed SOC processor device during testing.

Common approaches to high frequency delay fault testing carry many limitations. As stated above, typical test control units utilize the high frequency internal clock, or phase-locked loop (PLL) clock, of a processor when conducting delay fault tests. One common approach used by commercial testers to utilize the PLL clock of the processor is to gate off the clock at the clock output until the test is ready to begin. When the clock signal is needed to propagate the scanned in logic through the circuit of the device for the test, the test control unit tells the gate to allow a desired number of pulses through the gate. When the test is complete, the test control unit stops the PLL clock signal by closing the gate to the clock output. However, gating the clock off at the clock output may ultimately cause the delay fault test results to be inaccurate or error-prone.

One problem that may arise from this approach is that when the clock is gated off at the gate output, the clock tree is not running in a native state. Processor clock trees are finely tuned to run at the high frequencies of the internal clock. By gating the clock off at the clock output during the test phase, the clock tree quickly alternates between having no signal present on the tree to propagating the high frequency clock signal through the tree. Turning the clock on and off rapidly during testing may result in voltage fluctuations occurring along the clock tree. These fluctuations can cause large amounts of noise within the clock signal, thereby degrading the accuracy of the test results. Further, gating the PLL clock at the clock output alters the clock tree so that different characteristics of the circuit layout of the device are witnessed during testing versus normal functional operation of the device being tested. As a result, the delay fault tests conducted while gating the PLL clock at the clock output may not correlate to functional operation speeds of the delay. Therefore, the results of the delay fault test may not be an accurate depiction of the performance of the SOC device in the real world.

Further problems may result from gating the PLL clock at the clock output. SOC devices typically have separate domains of circuit design within the SOC chip. Thus, the PLL clock may branch from the clock output into many domains across the chip. However, during testing, it is sometimes preferable to individually test single domains of the SOC device rather than all domains at once. Testing of single domains of a SOC device is sometimes desirable because voltage shift may occur between domains when a device is under test. When the PLL clock is only gated at the clock output, the clock signal is sent to all of the domains on the SOC device simultaneously when the PLL clock is turned on. The clock signal propagating through a domain may cause a voltage shift to occur in a separate domain under test. This voltage shift may negatively affect the delay fault test result of the domain under test. Thus, when the PLL clock signal is gated at the clock output, a single domain cannot be tested in isolation resulting in possibly error-prone test results.

To address these problems, a mechanism may be provided that generates the localized at-speed clock of a desired number of pulses for delay fault testing while allowing the PLL clock to run in a more native environment. Further, a mechanism may be provided that allows for the testing of separate domains of a SOC device individually without interference of the signal caused from the other domains of the device. Various implementations may gate the input clock signal at the clock input to each domain of the SOC processor device rather than at the output of the PLL clock. The gating of the clock signal to each domain may then be controlled by clock stop signals generated by the ATPG testing device and sent to the individual domains of the processor device. The clock stop signals may turn off and on the clock signal at the input to the domains, thereby providing a desired number of clock signals to each domain for testing. As further discussed below, gating the clock signal at the domain may provide a more natural state for the circuit during testing, as well as allow the test control unit to test the different domains on the SOC device individually.

FIG. 1 is a block diagram illustrating one embodiment of an SOC device under a test. In this embodiment, a test control unit (TCU) 100 is connected to the SOC processor device 102 to test the manufacturing and design of the processor device 102. Several examples of a TCU device that may be used to test the design of the processor device include, but are not limited to, minimal logic testers, a JTAG state machine, or an external service processor (ASIC). Further, any computing device that provides a counter (or shift register) and can apply a pattern to the device under test may be used as a TCU in conformance with the present embodiment. In one example, TCU 100 may be configured to perform a delay fault test on SOC processor device 102. To conduct the delay fault test, TCU 100 may provide multiple signals to the device under test 102, including, but not limited to, a clock stop signal 104 for each domain of the SOC device 102, test logic or pattern 106, and a scan enable signal 108. Those skilled in the art will recognize that much information may pass between TCU 100 and the processor device 102 during the multiple stages of testing. A test trigger signal 110 may also be provided by a tester to TCU 100 to begin the testing operation. The signals provided herein are merely examples of some possible signals sent and received by TCU 100 during a delay fault test of the processor device 102.

In this embodiment, SOC processor device 102 under test may include a PLL clock 118. PLL clock 118 may provide the clock signals for SOC device 102. As explained above, PLL clock signals are typically of a high frequency and the clock signal distribution is typically finely tuned to accommodate the high frequency clock signal. Further included in processor device 102 may be multiple domains of circuit logic. In this embodiment, SOC device 102 may contain domain A 120, domain B 122 and domain C 124. However, those skilled in the art will recognize that SOC devices may have any number of domains contained within the device. Domain X 126 of FIG. 1 represents that SOC device 102 may contain any number of domains. Each domain of SOC device 102 may provide the functionality of a component of a typical computer. For example, domains 120-126 may function as a microcontroller, microprocessor, memory block or counters. These are just some examples of the function of the multiple domains within an SOC device and those skilled in the art will appreciate the many varied constructions and functions of typical SOC devices. As such, no further explanations of the constructions or functions of the domains of SOC device 102 will be provided.

In the embodiment depicted in FIG. 1, TCU 100 may include a counter 112, a test logic generator 114 and a clock stop signal generator 116. Several electronic devices may be used as the counter including, but not limited to, a shift register or a state machine. Similarly, several electronic devices may be used by the embodiment as clock stop signal generator, including but not limited to, a state machine or a jtag data register. As explained in more detail below, test logic generator 114 may generate a test pattern to be applied to the domains of the SOC processor device 102 that are to be tested. Counter 112 and clock stop signal generator 116 may provide signals to the processor device 102 to control the PLL clock signal to the domains of SOC device 102 under test. In one embodiment, SOC device 102 may provide a PLL clock signal 128 to TCU 100. As explained in further detail below, this clock signal 128 may be used by the counter 112 to count down at the same speed as the clock signal 128. As should be appreciated, TCU 100 may be implemented as a physical device or in computer-implemented software. Similarly, counter 112, logic generator 114 and clock stop signal generator 116 may also be implemented as physical devices or as computer-implemented software. Further, TCU 100 and the components thereof may be implemented as a combination of physical devices and computer-implemented software.

Figure 2:
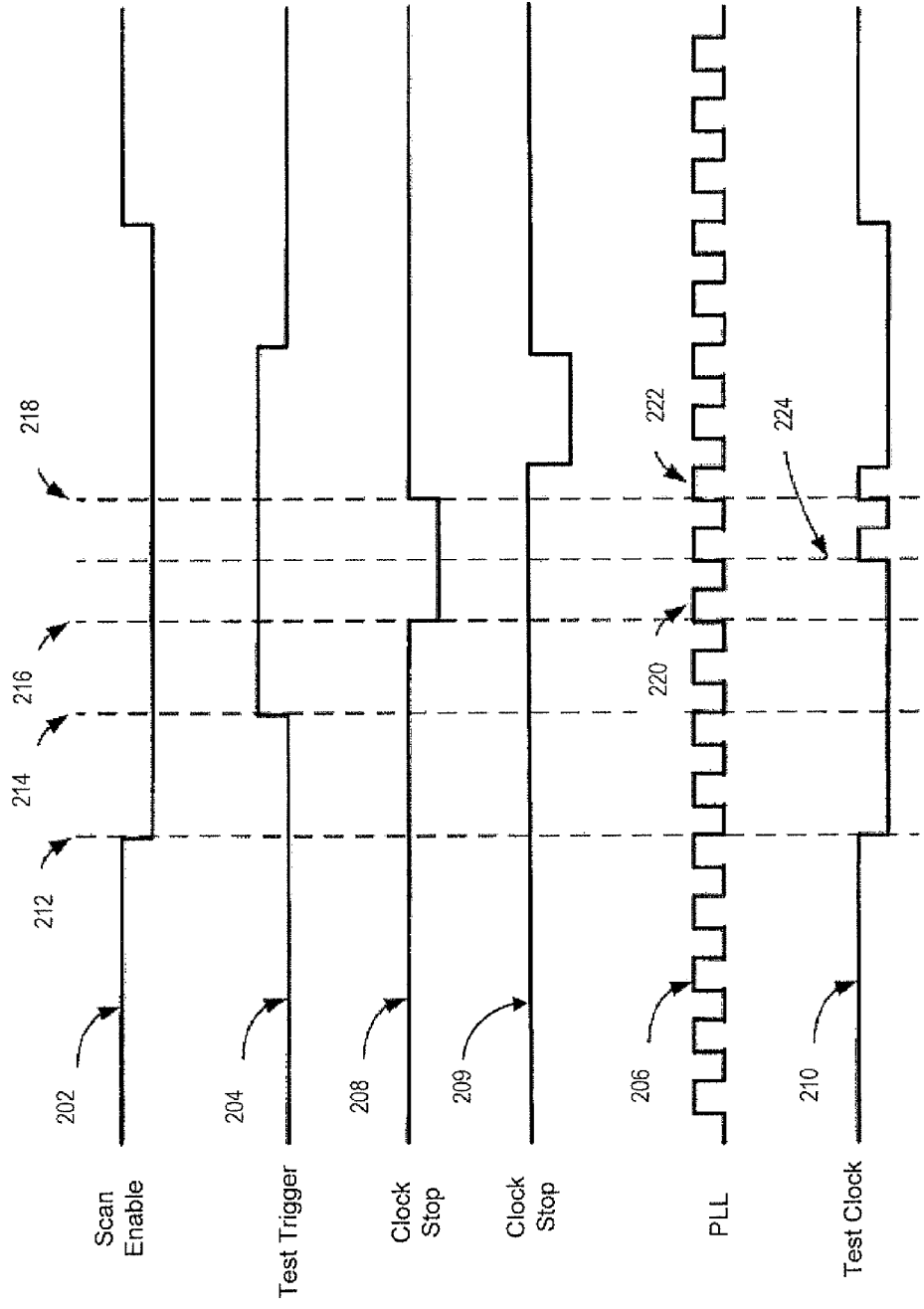
FIG. 2 is a timing diagram illustrating the timing of the signals transmitted during delay fault testing of one embodiment of the present invention.

FIG. 2 is a timing diagram illustrating the timing of the signals transmitted during delay fault testing according to one embodiment. The signals that may be sent from the testing device to the SOC processor device during a delay fault test may include a scan enable signal 202 and a clock stop signal 208. Further, a test trigger signal 204 may also be provided to the testing device to initiate the test. The scan enable 202, test trigger 204 and clock stop signals 208 depicted in FIG. 2 are the same signals depicted in FIG. 1 of the same name. Also depicted in FIG. 2 is PLL clock signal 206 and test clock signal 210. PLL clock signal 206 depicts the internal clock signal of the SOC device 102 under test as depicted in FIG. 1. Test clock signal 210 depicts the clock signal as seen by the particular domain or domains under test.

As stated above, one embodiment of the present invention may conduct a delay fault test on a SOC device to determine any delays in the structure of the manufactured device. As shown in FIG. 1, TCU 100 may be operably connected to the SOC device 102 under test. TCU 100 may provide signals to the SOC device 102 to conduct the test, including the test pattern and signals to begin and end the delay fault test.

Delay fault testing of the SOC device 102 may be conducted in the following manner. However, those skilled in the art will recognize that many different methods exist for performing a delay fault test of an SOC device 102. Initially, prior to conducting the delay fault test, the SOC device 102 may be prepared for transition testing. First, the PLL clock 118 of the SOC device 102 may be locked to the desired frequency to be tested. Second, the PLL clock signal to each domain 120-126 may be gated so as to block the clock signal from propagating through the domains. As described in more detail below, the clock signal may be gated through the clock stop signals (104, 208) provided by TCU 100. The final step in preparing the SOC device 102 for transition testing may be to scan load the test pattern into the device.

Test logic generator 106 of TCU 100 may generate the test pattern or logic to be applied to the domains of the SOC processor device 102 that are to be tested. The test pattern generated by logic generator 114 may be scanned into the SOC processor device 102 using a scan enable procedure, combining the generated test pattern and the scan enable signal 202 provided by TCU 100. Referring to FIGS. 1 and 2, scan enable signal 202 remains high prior to testing of the SOC device 102. As TCU 100 attempts to load test pattern in SOC device 102, scan enable signal 202 may be de-asserted at position 212. It should be noted that TCU 100 may be passive in loading the test pattern. Instead, the tester may control the loading directly with the TCU 100 waiting to operate after the loading is complete. Providing a deasserted scan enable signal at position 212 may allow the SOC device 102 to scan load the available test pattern to the domain or various domains to be tested.

Once the test pattern is scanned into processor device 102, delay fault testing of the processor device may begin. To facilitate the delay fault test, TCU 100 may also include a counter 104. During the scan enable procedure described above, the counter 104 may be set to a desired value of clock pulses needed to conduct the delay fault test. For example, the counter 104 may be set to a value of two to allow for two clock pulses to be applied to the SOC processor device 102 during the test. However, any number of desired clock pulses may be loaded into the counter. After the logic has been scanned in and the counter 104 has been set, delay fault testing of the SOC processor device 102 may begin.

Delay fault testing of the SOC processor device 102 may begin at position 214 when the test trigger signal 204 is asserted. Prior to testing, the test trigger signal is deasserted. The test trigger signal 204 indicates to the TCU 100 and SOC device 102 that testing of the device should begin.

At position 216, TCU 100 may deassert clock stop signal 208 to begin the delay fault test. Clock stop signal generator 116 of TCU 100 may generate clock stop signal 208. In this embodiment, each domain 120-126 of the SOC device 102 has a unique clock stop signal generated by clock stop signal generator 116. The clock stop signals generated by TCU 100 may control the gates at the input to each of the domains 120-126 of SOC device 102. For example, domain A may gate the PLL clock input to the domain to control the PLL clock signal propagating through the domain 120. This gate may be controlled by a clock stop signal generated by the clock stop signal generator 116 of TCU 100. Similarly, domain B 122 may also have a gate at the input to the domain to allow and prevent the PLL clock from propagating through the domain. A separate clock stop signal may be provided by TCU 100 for the gate of domain B. By providing separate clock stop signals to the separate domains of SOC device 102, TCU 100 may test the domains separately. Alternatively, TCU 100 may test multiple domains at the same time, if desired. For example, to facilitate the testing of both domain A and domain B, clock stop signal generator 116 may deassert the clock stop signals for both domain A and domain B at the same time. By providing the clock stop signals to all of the domains of SOC device 102, clock stop signal generator 116 can control the testing of any number of domains within the device as desired.

Returning to FIGS. 1 and 2, upon deassertion of clock stop signal 208 at position 216, the counter 112 of TCU 100 begins decrementing. As mentioned above, SOC device 102 may provide the PLL clock signal 128 to TCU 100. TCU 100 may apply the PLL clock signal 128 to counter 112 so that counter 112 decrements at the same frequency as the PLL clock. The clock stop signal 208 may remain deasserted, thereby opening the PLL gate of the domain under test, until the counter 112 reaches 0. When the counter 112 reaches 0, the clock stop signal 208 may then be reasserted at position 218, thereby closing the PLL gate of the domain under test. Through this manner, counter 112 may control the number of PLL clock pulses that are propagated through the domain under test.

Referring to FIG. 2, clock stop signal 208 is deasserted at position 216. In this embodiment, counter 112 was loaded with a value of two to provide two PLL clock pulses to the domain under test. Thus, clock stop signal 208 may be deasserted on the upward edge of PLL clock pulse 220. Counter 112 may then begin decrementing. When the clock stop signal 208 is deasserted, the gate at the PLL input to the domain under test is opened, allowing the PLL clock signal to propagate through the domain. Test clock signal 210 illustrates the PLL clock signal as seen by the domain under test. At the first leading edge after the gate is opened, the PLL clock signal is allowed through the domain at position 224. At position 218, the clock stop signal is reasserted when counter 112 reaches a value of zero. Because counter 112 was loaded with a value of two, clock stop signal 208 is reasserted on the second leading edge of the PLL clock signal after the clock stop signal was deasserted. At the same position 218, the second PLL clock pulse is allowed to propagate through the domain as the gate at the PLL input to the domain remains open. However, upon deassertion of the clock stop signal 208 at position 218, the gate is closed and no further PLL clock signals are allowed through. Through this manner, TCU 100 may control the number of PLL clock signals to propagate through the separate domains of SOC device 102.

In another embodiment, the counter 112 may be adjusted to test domains that operate on a slower clock frequency. Some domains of SOC device 102 may require a slower clock frequency than that of the PLL clock 118. Many testing device accommodate the slower clock frequency through logic applied to the clock tree. However, applying logic to the clock tree may negatively affect the test results as the SOC device is not being operated in its native environment. In this embodiment, counter 112 may be adjusted to account for the slower clock frequency rather than negatively impacting the clock tree of the SOC device 102. For example, assume that domain A operates with a clock speed one-half that of the PLL clock frequency and a delay fault test requires 2 clock pulses. Because counter 112 decrements at the rate of the PLL clock frequency, counter 112 cannot be loaded with a value of two. Instead, the value loaded into counter 112 may be adjusted up to account for the slower clock signal of domain A. In this example, counter 112 may be loaded with a value of four. Thus, the clock stop signal for domain A would remain deasserted for four PLL clock cycles, or two cycles of the slower clock frequency. In this manner, domain A would receive two clock pulses of the slower clock frequency without having to apply logic to the clock tree. Through the adjustment of the counter 112, the embodiment may test multiple domains of SOC device 102 of varying clock frequencies without interfering with the normal operation of the PLL clock tree.

Returning to FIG. 2, after conducting the desired delay fault tests of the SOC device 102, test trigger signal 204 and scan enable signal 202 may return to their pre-testing positions to prepare TCU 100 to conduct another test.

In another embodiment, TCU 100 may be configured to conduct tests of multiple domains of a SOC device 102 without the necessity of recalibrating TCU 100 in between tests. For example, TCU 100 may be loaded with a series of test patterns and counter values for the multiple tests to be conducted. Then, TCU 100 may run tests on the first domain using the clock stop signal for that domain (e.g., clock stop signal 208), scan enable the new test pattern and clock value and run the test on a second domain using the clock stop signal for the second domain (e.g., clock stop signal 209). In this manner, TCU 100 may run through multiple tests on separate domains of SOC device 102 without stopping and restarting the testing unit. In particular, TCU 100 may conduct the tests across all of the domains of the SOC device in a serial manner, testing each domain individually and separate from the other domains. As noted above, testing the domains of SOC device 102 separately may provide more accurate test results. Further, having the capability to test all of the domains of a SOC device without the necessity of intervening steps would result in faster test times.

Figure 3:
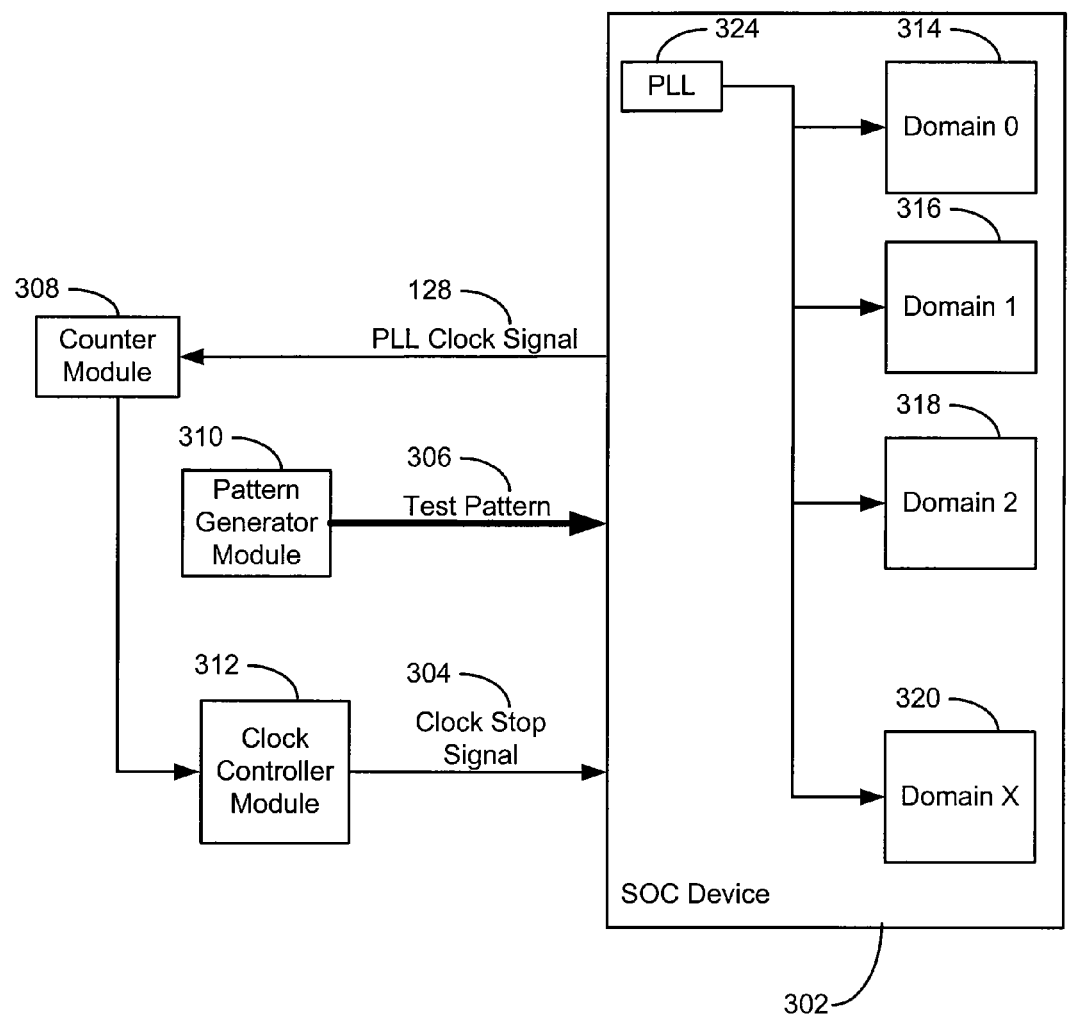
FIG. 3 is a block diagram illustrating a further embodiment of the present invention to perform delay fault testing of a SOC device.

FIG. 3 is a block diagram illustrating a further embodiment of the present invention to perform delay fault testing of a SOC device 302. This embodiment may be a computer-implemented system that operates in a similar manner as the embodiments described above. As such, the modules described may be implemented in a hardware device or a plurality of hardware devices. The modules may also be implemented in computer implemented software. While some implementations of the embodiment are provided, it should be appreciated that the implementation of the modules of this particular embodiment are not limited to the examples provided.

Similar to the SOC processor device of FIG. 1, SOC processor device 302 under test in the embodiment of FIG. 3 may include a PLL clock 324. PLL clock 324 may provide the clock signals for SOC device 302. As explained above, PLL clock signals are typically of a high frequency and the clock signal distribution is typically finely tuned to accommodate the high frequency clock signal. Further included in processor device 302 may be multiple domains 314-320 of circuit logic. In this embodiment, SOC device 302 may contain domain A 314, domain B 316 and domain C 318. However, those skilled in the art will recognize that SOC devices may have any number of domains contained within the device. Domain X 320 represents that SOC device 302 may contain any number of domains. Also similar to SOC processor device of FIG. 1, each domain of SOC device 302 may provide the functionality of a component of a typical computer.

In the embodiment depicted in FIG. 3, a clock controller module 312 may be operably connected to the SOC device. Similar to the embodiments described above, clock controller module 312 may provide a clock stop signal 304 to SOC device 302. Each domain 314-320 of the SOC device 302 may have a unique clock stop signal generated by clock controller module 312. The clock stop signals generated by clock controller module 312 may control the gates at the PLL clock signal input to each of the domains 314-320 of SOC device 302. For example, domain A 314 may gate the PLL clock input to the domain to control the PLL clock signal propagating through the domain 314. This gate may be controlled by a clock stop signal generated by the clock controller module 312. Similarly, domain B 316 may also have a gate at the input to the domain to allow and prevent the PLL clock signal from propagating through the domain 316. A separate clock stop signal may be provided by clock controller module 312 for the gate of domain B 316. By providing separate clock stop signals to the separate domains of SOC device 302, the separate domains may be tested separately. Alternatively, multiple domains may be tested at the same time, if desired.

Also involved in this embodiment is a pattern generator module 310. Pattern generator module 310 may generate the test pattern 306 or logic to be applied to the domains of the SOC processor device 302 that are to be tested. The test pattern 306 generated by pattern generator module 310 may be scanned into the SOC processor device 302 using a scan enable procedure similar to those described above in other embodiments.

To facilitate the delay fault test, the embodiment depicted in FIG. 3 may also include a counter 308. During testing, counter module 308 may be set to a desired value of clock pulses needed to conduct the delay fault test. For example, the counter module 308 may be set to a value of two to allow for two clock pulses to be applied to the SOC processor device 302 during the test. However, any number of desired clock pulses may be loaded into the counter module 308.

During testing, counter module 308 may begin decrementing. Further, SOC device 302 may provide the PLL clock signal 322 to counter module 308 so that counter module 308 decrements at the same frequency as the PLL clock. The clock controller module 312 may maintain the PLL gate of the domain under test in an open configuration, until the counter module 308 reaches 0. When the counter module 308 reaches 0, the clock controller module 312 may then close the PLL gate of the domain under test. Through this manner, counter module 308 may control the number of PLL clock pulses that are propagated through the domain under test.

The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustration only and are not intended to limit the scope of the present invention. References to details of particular embodiments are not intended to limit the scope of the invention.

What is claimed is:

1. A method for testing at least one domain of a processor device including a plurality of domains, the method comprising:
   generating at least a first clock stop signal and a second clock stop signal at a clock control module;
   transmitting the first clock stop signal to a first gate coupled to a first one of the plurality of domains;
   transmitting the second clock stop signal to a second gate coupled to a second one of the plurality of domains; and
   serially controlling propagation of a clock signal into:
      the first domain at the first gate by deasserting the first clock stop signal during a first time period; and
      the second domain at the second gate by deasserting the second clock stop signal during a second time period;
      wherein the second period of time occurs after the first period of time; and
      wherein the first gate only controls propagation of the clock signal into the first domain, and wherein the second gate only controls propagation of the clock signal into the second domain; and
   serially testing the first domain and second domain by:
      providing a test pattern to the first domain while deasserting the first clock stop signal at the first gate; and providing a new test pattern to the second domain while deasserting the second clock stop signal at the second gate.

2. The method of claim 1 wherein the controlling propagation further comprises:
deasserting the first clock stop signal to open the first gate and allow the clock signal to propagate into the first domain;
maintaining the open first gate for a desired number of clock pulses; and
asserting the first clock stop signal to close the first gate and prevent the clock signal from propagating into the first domain.

3. The method of claim 1 further comprising:
loading a first value into a counter, the first value indicative of a desired number of clock pulses.

4. The method of claim 3 wherein the controlling propagation further comprises:
deasserting the first clock stop signal to open the first gate;
decrementing the counter from the first value upon opening the first gate; and
asserting the first clock stop signal to close the first gate when the counter reaches zero.

5. The method of claim 4 wherein the decrementing operation further comprises: decrementing the counter at a same frequency as the clock signal.

6. The method of claim 4 further comprising:
loading a second value into the counter after the first gate is closed;
decrementing the counter from the second value upon opening the second gate; and
closing the second gate when the counter reaches zero.

7. The method of claim 1 wherein controlling the propagation comprises:
controlling a plurality of gates, the plurality of gates each coupled to a respective domain of the plurality of domains of the processor device, wherein the plurality of gates are configured to serially control propagation of a clock signal into the respective domains of the processor device.

8. The method of claim 7 wherein controlling the propagation further comprises:
transmitting a plurality of clock stop signals to the plurality of gates to close the plurality of gates;
deasserting at least one of the plurality of clock stop signals to open at least one gate of the plurality of gates while maintaining remaining gates closed;
maintaining the at least one gate open for a desired number of clock pulses; and
asserting at least one of the plurality of clock stop signals to close the at least one gate upon occurrence of the desired number of clock pulses with the at least one gate open.

9. The method of claim 1 further comprising:
providing the test pattern to the processor device; and
providing a scan enable signal to the processor device, wherein, upon receipt of the scan enable signal, the processor scans in the test pattern.

10. A system for testing at least one domain of a processor device including a plurality of domains, the system comprising:
a first gate coupled to a first domain to propagate a clock signal into the first domain;
a second gate coupled to a second domain to propagate the clock signal into the second domain;
a clock gate controller to:
generate at least:
a first clock stop signal to control propagating of the clock signal into the first domain at the first gate; and
a second clock stop signal to control propagating of the clock signal into the second domain at the second gate; and
dessert the first clock stop signal during a first time period to propagate the clock signal into the first domain; and
dessert the second clock stop signal during a second time period to propagate the clock signal into the second domain, wherein the second time period occurs after the first time period; and
serially test the first domain and second domain by:
providing a test pattern to the first domain while deasserting the first clock stop signal; and
providing a new test pattern to the second domain while deasserting the second clock stop signal.

11. The system of claim 10 further comprising:
a pattern generator configured to provide the test pattern to the processor device; and a counter operably connected to the clock gate controller.

12. The system of claim 11 wherein the counter decrements from a provided value, the provided value indicative of a desired number of clock pulses.

13. The system of claim 12 wherein the clock gate controller closes the first gate coupled to the first domain when the counter reaches zero.

14. The system of claim 10 wherein the clock gate controller is configured to control a plurality of gates, the plurality of gates each coupled to a respective domain of the plurality of domains of the processor device.

15. A computer-implemented system for testing at least one domain of a processor device including a plurality of domains, the system comprising:
a first gate coupled to a first domain to propagate a clock signal into the first domain;
a second gate coupled to a second domain to propagate the clock signal into the second domain;
a clock gate controller to:
generate at least:
a first clock stop signal to control propagating of the clock signal into the first domain at the first gate; and
a second clock stop signal to control propagating of the clock signal into the second domain at the second gate; and
dessert the first clock stop signal during a first time period to propagate the clock signal into the first domain; and
dessert the second clock stop signal during a second time period to propagate the clock signal into the second domain, wherein the second time period occurs after the first time period; and
serially test the first domain and second domain by:
providing a test pattern to the first domain while deasserting the first clock stop signal; and
providing a new test pattern to the second domain while deasserting the second clock stop signal.

16. The system of claim 15 further comprising:
a pattern generator module configured to provide the test pattern to the processor device; and
a counter module operably connected to the clock gate controller module.

17. The system of claim 16 wherein the counter module decrements from a provided value, the value provided indicative of a desired number of clock pulses.

18. The system of claim 17 wherein the clock gate controller module closes the first gate coupled to the first domain when the counter reaches zero.

19. The system of claim 15 wherein the clock gate controller module is configured to control a plurality of gates, the plurality of gates each coupled to a respective domain of the plurality of domains of the processor device.

* * * * *